United States Patent [19]

Molnar

[11] 4,357,180

[45] Nov. 2, 1982

[54] ANNEALING OF ION-IMPLANTED GAAS AND INP SEMICONDUCTORS

[75] Inventor: Bela Molnar, Alexandria, Va.

[73] Assignee: The United States of America as represented by the Secretary of the Navy, Washington, D.C.

[21] Appl. No.: 228,425

[22] Filed: Jan. 26, 1981

[51] Int. Cl.$^3$ .................... H01L 21/263; H01L 29/48
[52] U.S. Cl. .................... 148/1.5; 148/175; 357/61
[58] Field of Search .................... 357/61; 148/1.5, 175

[56] References Cited

U.S. PATENT DOCUMENTS

| | | | |
|---|---|---|---|
| 3,547,635 | 12/1970 | Kennard et al. | 96/48 |
| 3,644,154 | 2/1972 | Hoogendoorn | 148/187 |
| 3,720,515 | 3/1973 | Stanley | 96/38.4 |
| 3,737,282 | 6/1973 | Hearn et al. | 148/1.5 |
| 3,762,945 | 10/1973 | DiLorenzo | 117/215 |
| 3,984,263 | 10/1976 | Asao et al. | 148/1.5 |
| 4,016,006 | 5/1977 | Yoshinaka et al. | 148/1.5 |
| 4,155,784 | 5/1979 | Mills et al. | 21/205 |
| 4,173,063 | 11/1979 | Kniepkamp et al. | 29/571 |
| 4,179,533 | 12/1979 | Christou et al. | 427/84 |

OTHER PUBLICATIONS

Malbon, Lee, Whelan; "Annealing of Ion-Implanted GaAs in a Controlled Atmosphere"; J. Electrochem. Soc.: Solid-State Science and Tech.; vol. 123, No. 9; Sep. 1976; pp. 1413–1415.

Sealy, Surridge; "A New Thin Film Encapsulant for Ion-Implanted GaAs", Thin Solid Films, 26, (1975), L19–L–22; Switzerland.

Kasahaka, Arai, Wattanabe; "Capless Anneal of Ion-Implanted GaAs in Controlled Arsenic Vapor"; J. Appl. Physc. 50 (1); Jan. 1979; pp. 541–543.

Immorlica et al., Appl. Phys. Letts. 29, (1976), 94.

Woodall et al., IBM-TDB, 10 (1968), 1476.

*Primary Examiner*—Upendra Roy
*Attorney, Agent, or Firm*—Robert F. Beers; William T. Ellis; Kenneth E. Walden

[57] ABSTRACT

A method of annealing both N and P-type ion-implanted GaAs and InP semiconductors by using a close-contact capping technique. A flat polished ion-implanted surface on a gallium arsenide (GaAs) or indium phosphide (InP) semiconductor is placed in face-to-face contact with a non-reactive flat surface such as $Si_3N_4$, $SiO_2$, AlN, or identical semiconductor material, and annealed at selected elevated temperatures and time dependent upon ion concentration. The annealed semiconductor material, usually in the form of a wafer, is allowed to cool to room temperature for further processing.

8 Claims, 8 Drawing Figures

ANNEALING OF ION-IMPLANTED GAAS AND INP SEMICONDUCTORS

BACKGROUND OF THE INVENTION

There is considerable interest in ion-implantation doping of GaAs and InP, especially for microwave uses. Ion-Implantation is considered to be an alternative to diffusion for the creation of a heavily doped thin region beneath the surface of the seimconductor material. Heat treating GaAs or InP is necessary after most ion-implantations for two purposes: (1) to increase the electrical activity of the implanted ions; and (2) to remove the lattice damage caused in the material by the ions during their implantation.

It has been learned that ion-implanted semiconductors during annealing undergo incongruent evaporation at temperatures lower than their annealing temperatures. Therefore, it is now standard practice to encapsulate the semiconductors with suitable dielectric layers during annealing, or to anneal the semiconductors in a carefully controlled environment to prevent evaporation from their surfaces. In all cases, the goal has been to develop an annealing process which preserves the chemical and electrical properties of the implanted material during high temperature annealing, while providing high mobility and activation of the implanted semiconductor material.

Prior methods of annealing smooth surfaces of ion-implanted GaAs or InP have often involved a step of depositing a dielectric encapsulating film of thermal matching characteristics on the implanted surface, and removing it after annealing.

SUMMARY OF THE INVENTION

The process disclosed herein relates to annealing ion-implanted GaAs and InP semiconductor wafers. The flat ion-implanted surface on the semiconductor is covered by another flat surface (nonreactive) in close contact therewith during the annealing process. The covering material may be identical semiconductor material provided with a surface of the same general smoothness to allow for the necessary close physical contact. In the alternative, the covering may be the same material, polished to the same smoothness as the unannealed semiconductor, covered with a thin coat of dielectric material such as $Si_3N_4$, $SiO_2$ or AlN, which actually contacts the ion-implanted surface.

OBJECTS OF THE INVENTION

It is therefore an object of this invention to provide a method of annealing ion-implanted semiconductor wafers.

It is another object of this invention to provide a method of annealing ion-implanted semiconductor wafers wherein the unannealed surface is overlaid by a like material to prevent evaporation during the annealing steps.

It is still another object of this invention to provide a method of annealing ion-implanted semiconductor wafers wherein the unannealed surface is overlaid by a like material which is covered by another dielectric material to prevent evaporation during the annealing steps.

Other objects of the invention will become apparent after consideration of the specification and claims in conjunction with the drawings.

DESCRIPTION OF THE PREFERRED PROCESS

The process described herein relates to the annealing of N or P-type GaAs or InP semiconductor materials (wafers) which have already had one of their plane surfaces polished and implanted with ions by any one of the well-known methods in the art.

Figure 1:
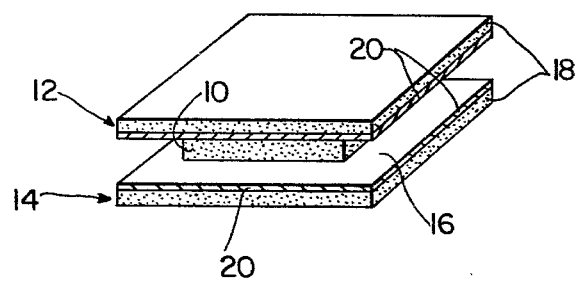
FIG. 1 is a perspective view of an ion-implanted semiconductor material wafer or slice sandwiched between two covering pieces.

As shown in FIG. 1, semiconductor wafer 10 is sandwiched between somewhat larger top and bottom covering pieces which are identified generally by numerals 12 and 14, respectively. One type of semiconductor 10 may be chromium (Cr) doped GaAs material with one of its planar surfaces or faces polished and implanted with beryllium ($Be^+$) ions. Another type of semiconductor 10 may be iron (Fe) doped InP material with one of its planar surfaces implanted with silicon ($Si^+$) or selenium ions ($Se^+$). The semiconductor is positioned between the covering pieces as shown in FIG. 1, preferable with its ion-implanted surface facing the bottom covering piece 14. Top covering piece 12, which may be identical to the bottom covering piece, serves only as a nonreactive mass to help maintain the semiconductor 10 in face-to-face contact with the surface of bottom covering piece 14.

Figure 2:
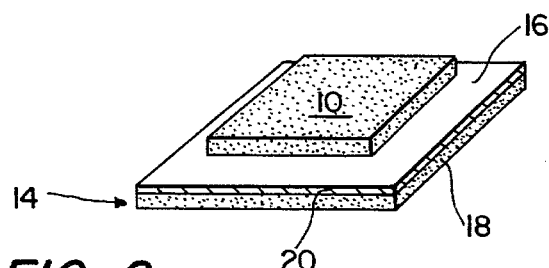
FIG. 2 is a perspective view of an ion-implanted semiconductor material (wafer or slice) positioned atop a covering piece.

An alternate arrangement is shown in FIG. 2 where the semiconductor 10 is positioned with its ion-implanted surface facing down on bottom covering piece 14, without the benefit of a top covering piece. The surface areas of the covering pieces, and particularly the covering piece facing the ion-implanted surface, are somewhat greater than the surface area of semiconductor wafer or chip 10. When the wafer or chip is centrally positioned on or between the covering, as shown in FIGS. 1 and 2, there is defined an overhanging or shelf-like peripheral surface 16 at hereabout. The covering pieces may each be formed of a semiconductor material (not shown) identical to that of the wafer or chip being annealed.

The covering pieces may be made in another form for serving their purpose in the annealing process. As shown in FIGS. 1 and 2, each covering piece includes a backing or substrate 18 covered by a deposit or overlay 20. The substrate may be a material identical to the semiconductor material (GaAs or InP) to be annealed with its surface polished to a smoothness substantially matching that on the semiconductor surface and have a thin coating of silicon nitride ($Si_3N_4$) applied thereon. Obviously only one covering piece (bottom) need be so formed because the other covering piece (top) is not in contact with the ion-implanted surface. The top piece, serving as a mass, need only be formed of a material nonreactive with $Si_3N_4$, GaAs or InP. But, for convenience both covering pieces are preferable identical.

Several alternative arrangements are possible, all within the scope of this invention. For example, substrate 18 may be formed of silicon (Si) and overlaid with a dielectric material such as silicon nitride ($Si_3N_4$), quartz ($SiO_2$), or aluminum nitride (AlN). It is essential that all these materials be nonreactive with GaAs or InP at the elevated annealing temperatures.

As shown in FIG. 2 semiconductor wafer 10 lies centrally disposed on covering piece 14 with its ion-implanted surface facing downward. The semiconductors own weight is sufficient to maintain it in position and in face-to-face contact with the covering piece during the annealing process.

Figure 3:
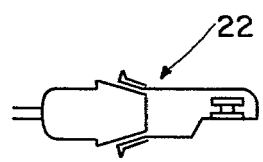
FIG. 3 illustrates a quartz bottle which is used for holding the semiconductor material and covering piece or pieces during annealing.
Figure 4:
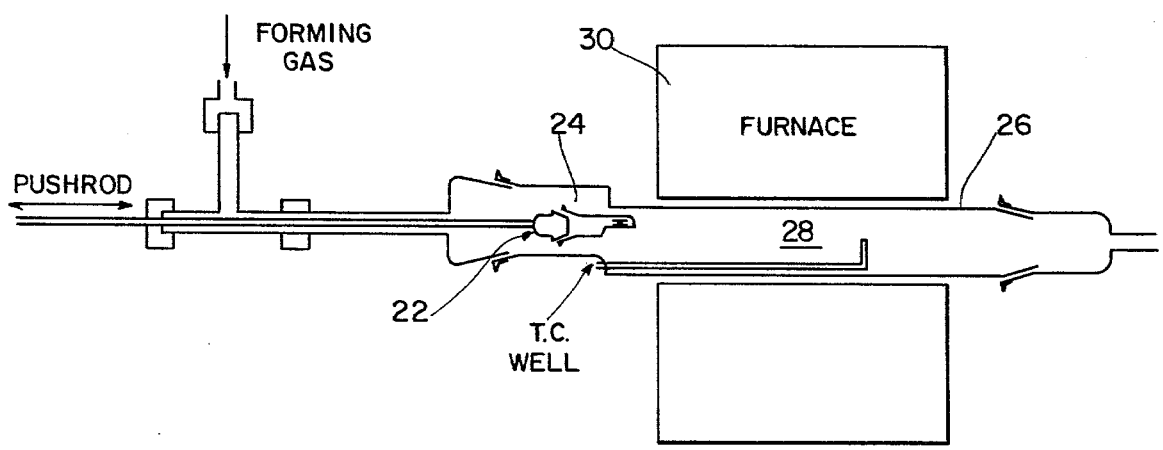
FIG. 4 illustrates annealing equipment including purging apparatus and a furnace.

The apparatus and steps involved in the present annealing process for ion-implanted semiconductor wafers 10 as arranged in FIGS. 1 and 2 will now be described. The semiconductor, which has been ion-implanted across its entire surface together with its covering piece or pieces, is placed in a small quartz bottle 22 shown in FIG. 3. The bottle is then loaded into the cold part 24 of annealing tube 26 and remains open during a purging period. Forming gas (15% $H_2$ and 85% $N_2$) provides the ambient environment. After several minutes of purging the bottle is pushed into the hot section 28 of furnace 30 and tightly closed. The semiconductor wafers are annealed at elevated temperatures, depending on whether GaAs or InP material, for around 10–20 minutes. After annealing bottle 22 is pulled back to the cold section 24 where it remains closed until it has reached room temperature. The gas inside the bottle is then changed to $N_2$ and the annealed wafer or chip is removed from the bottle. The semiconductor material is ion-implanted across its entire surface. It is desirable that this surface, when annealed, exhibit a surface free of pock marks left by evaporation. Therefore, the covering pieces preferable have a larger area then the semiconductors wafer or chip so that they extend beyond the peripheral edges thereof to assure proper annealing across its entire surface.

The annealing temperature and time is dependent upon ion concentration. Generally, GaAs semiconductor wafers are annealed at around 800° to 1000° for 15 to 20 minutes and InP semiconductor wafers are annealed at around 700° to 800° C. for 10 to 20 minutes.

EXAMPLE (GaAs)

Figure 5A:
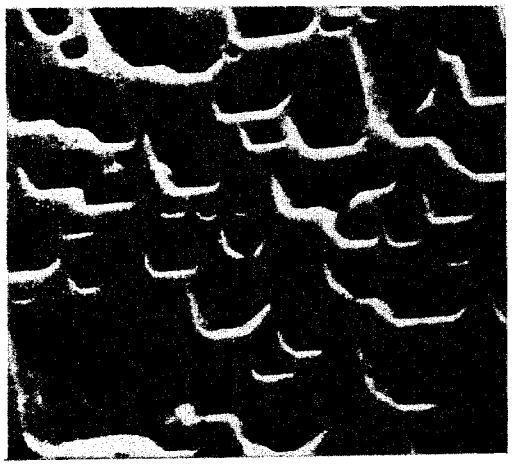
FIG. 5a is a photomicrograph of an ion-implanted surface of a GaAs semiconductor which was uncovered during the annealing process.
Figure 5B:
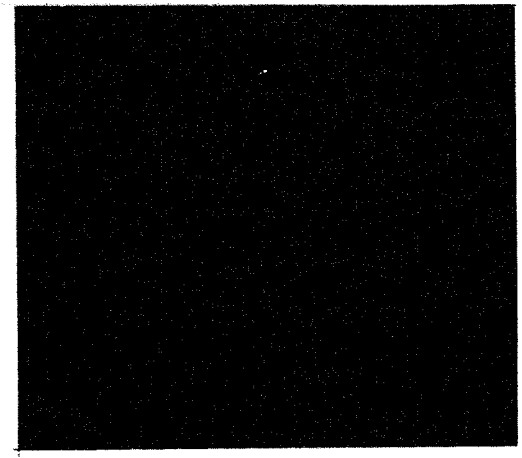
FIG. 5b is a photomicrograph of the ion-implanted surface of a GaAs semiconductor which was annealed according to the present invention.

Semiconductor wafers used in tests were all (100) orientated substrates of GaAs or InP. For electrical measurements, either chromium doped GaAs or iron doped InP semi-insulation substrates were used. The wafers were $Be^+$ ion-implanted for P-type dopant and $Si^+$ or $Se^+$ ion-implanted for N-type dopant. The substrates were at room temperature during the ion-implantation. FIGS. 5a and 5b are photomicrograph providing a basis for making a comparsion of the morphology of two identical $Cr^+$-doped, $Be^+$-implanted GaAs substrates which were heated together at 800° C. for 25 minutes. Each surface had been previously etched and polished and was implanted with $5.58 \times 10^{15}/cm^2$ 150-KeV $Be^+$ ions. The surface shown in the photomicrograph (6000X) of FIG. 5a was left uncovered and exposed to the ambient during the annealing process. It is obvious from an examination that its surface had undergone severe evaporation which left the previously polished surface highly pocked. The photomicrograph in FIG. 5b shows the companion substrate at 6000X as having no discernible morphological features.

EXAMPLE (InP)

Figure 6A:
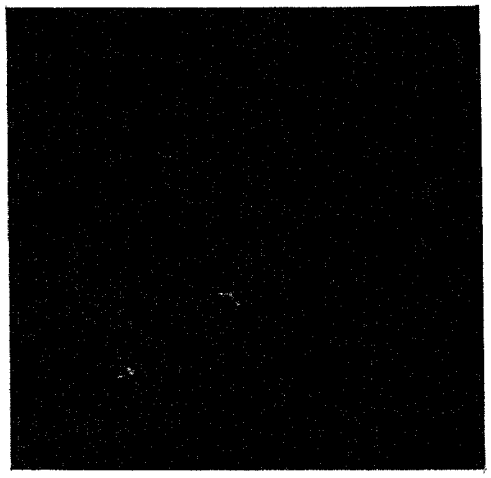
FIG. 6a is a photomicrograph of an ion-implanted surface of an InP semiconductor which was uncovered during annealing.
Figure 6B:
FIG. 6b is a photomicrograph of an ion-implanted surface of an InP semiconductor which was annealed according to the present invention.

A comparison of the morphology of two identical ion-implanted substrates of InP may be made from FIG. 6a and 6b. These samples were implanted with $2.16 \times 10^{12}/cm^2$, 100 KeV and $6.45 \times 10^{12}/cm^2$, 240 KeV 29Si ions. The dual implantation was performed in order to achieve a uniform silicon donor concentration of $1.8 \times 10^{17}/cm^3$ level over 4000 A thickness. The wafers were annealed at 760° C. for 15 minutes. The sample shown in the FIG. 6a photomicrograph (6000X) was annealed unprotected and exposed directly to the ambient. The sample shown in the FIG. 6b photomicrograph (6000X) was covered in face-to-face contact with $Si_3N_4$ covered InP. There is no resolvable morphgical feature.

The process described therein is effective for the electrical activation of ion-implanted GaAs and InP. The results indicate (FIGS. 5b and 6b) that there is very little evaporation from the surfaces of the samples when they are annealed according to the method of the invention disclosed and claimed herein.

The invention is directed to alternate embodiments for annealing two different ion-implanted semiconductor materials and has been described herein in considerable detail. It will be understood that variations and modifications can be made to the method without departing from the spirit and scope of the invention, which is limited only by the scope of the claims annexed hereto.

What is claimed and desired to be secured by Letters Patent of the United States is:

1. A process of annealing ion-implanted semiconductor material comprising the steps of:
   selecting an unannealed semiconductor material having an ion-implanted polished surface;
   selecting a like semiconductor material having a polished surface larger than that of the first-mentioned surface;
   positioning the unannealed semiconductor material in surface-to-surface contact with the larger surface which extends beyond the periphery of the smaller surface;
   maintaining the surfaces in contact; and
   annealing the ion-implanted semiconductor material substantially in the absence of oxygen whereby evaporation of material from the implanted surface is minimized.

2. A process of annealing an ion-implanted semiconductor material comprising:
   selecting an unannealed semiconductor material from the group consisting of GaAs and InP having a polished surface implanted with ions selected from the group consisting of $Be^+$, $29Si^+$ and $Se^+$;
   selecting a like semiconductor material having a surface area greater than the area of the ion-implanted surface and provided with a coating of dielectric material on the surface selected from the group consisting of $Si_3N_4$, $SiO_2$ and AlN polished to a smoothness substantially matching that of the first mentioned surface;

positioning the surfaces in face-to-face contact with peripherial portions of the larger surface surrounding the, smaller surface;

maintaining the surfaces in contact; and annealing the ion-implanted semiconductor material in an atmosphere of nitrogen and hydrogen whereby evaporation of material from the implanted surface is minimized.

3. The process according to claim 2 comprising a further step of selecting an annealing atmosphere of approximately 15% $H_2$ and 85% $N_2$.

4. The process according to claim 2 or 3 comprising annealing the ion-implanted semiconductor material at a temperature of about 800°–1000° C. for about 15–20 minutes when the material is GaAs.

5. The process according to claim 2 or 3 comprising annealing the ion-implanted semiconductor material to a temperature of about 700°–800° C. for about 15–20 minutes when the material is InP.

6. A process of annealing a wafer of ion-implanted semiconductor material comprising the steps of:

selecting an unannealed semiconductor wafer selected from the group consisting of GaAs and InP having a polished planar surface implanted with ions selected from the group consisting of $Be^+$, $29Si^+$ and $Se^+$;

coating a Si matrix with a layer of dielectric material selected from the group consisting of $Si_3N_4$, $SiO_2$ and AlN;

providing a polished planar surface on the dielectric material having an area larger than the area of the planar surface on the semiconductor wafer;

positioning the polished surfaces together in face-to-face contact with excess area of the larger planar surface extending beyond the outer periphery of the smaller planar surface;

maintaining the surfaces in face-to-face contact;

planning the positioned materials into a container;

purging the container to have an embient environment gas of approximately 15% $H_2$ and 85% $N_2$;

placing the container in a furnace at an elevated temperature for a predetermined time;

removing the container from the furnace and allowing the materials to cool to substantially room temperature;

changing the ambient gas to $N_2$; and removing the annealed semiconductor.

7. The process according to claim 6 comprising the step of maintaining a GaAs ion-implanted semiconductor wafer at a temperature of 800°–1000° C. for about 15–20 minutes.

8. The process according to claim 6 comprising the step of maintaining an InP ion-implanted semiconductor wafer at a temperature of 700°–800° C. for about 15–20 minutes.

* * * * *